United States Patent
Shim et al.

(10) Patent No.: US 8,830,785 B2
(45) Date of Patent: Sep. 9, 2014

(54) SEMICONDUCTOR MEMORY APPARATUS

(71) Applicant: Hynix Semiconductor Inc., Icheon-si (KR)

(72) Inventors: Sung Bo Shim, Kyungki-Do (KR); Sang Don Lee, Kyungki-Do (KR); Jong Woo Kim, Seoul (KR)

(73) Assignee: SK hynix Inc., Icheon-Si (KR)

( * ) Notice: Subject to any disclaimer, the term of this patent is extended or adjusted under 35 U.S.C. 154(b) by 64 days.

(21) Appl. No.: 13/753,648

(22) Filed: Jan. 30, 2013

(65) Prior Publication Data

US 2013/0142002 A1 Jun. 6, 2013

Related U.S. Application Data

(62) Division of application No. 12/973,000, filed on Dec. 20, 2010, now Pat. No. 8,391,043.

(30) Foreign Application Priority Data

Dec. 23, 2009 (KR) ................ 2009-129751

(51) Int. Cl.
| | |
|---|---|
| *G11C 8/00* | (2006.01) |
| *G11C 8/10* | (2006.01) |
| *G11C 8/12* | (2006.01) |
| *G11C 7/18* | (2006.01) |
| *G11C 16/08* | (2006.01) |
| *G11C 16/04* | (2006.01) |
| *G11C 8/14* | (2006.01) |

(52) U.S. Cl.
CPC .. *G11C 8/10* (2013.01); *G11C 8/12* (2013.01); *G11C 8/14* (2013.01); *G11C 7/18* (2013.01); *G11C 16/08* (2013.01); *G11C 16/04* (2013.01)
USPC ............ 365/230.06; 365/230.03; 365/230.01; 365/238.5

(58) Field of Classification Search
CPC .............. G11C 8/10; G11C 8/12; G11C 8/14; G11C 16/08
USPC ................ 365/230.06, 230.03, 230.01, 238.5
See application file for complete search history.

(56) References Cited

U.S. PATENT DOCUMENTS 6,026,021 A * 2/2000 Hoang ...................... 365/185.11
6,064,621 A * 5/2000 Tanizaki et al. .......... 365/230.03
(Continued)

FOREIGN PATENT DOCUMENTS

| CN | 1154559 | 7/1997 |
| CN | 101119113 | 2/2008 |

(Continued)

OTHER PUBLICATIONS

Notice of Allowance to Korean Patent Application No. 10-2009-0129751 issued Jul. 27, 2011.

(Continued)

*Primary Examiner* — Viet Q Nguyen
(74) *Attorney, Agent, or Firm* — Marshall, Gerstein & Borun LLP (57) ABSTRACT

A semiconductor memory apparatus comprises first and second memory blocks each comprising semiconductor elements coupled to first and second local line groups, a first switching circuit configured to couple a first global line group to the first local line group of the first memory block in response to a block selection signal, a second switching circuit configured to couple a second global line group to the second local line groups of the first and second memory blocks in response to the block selection signal, and a third switching circuit configured to couple the first global line group to the first local line group of the second memory block in response to the block selection signal.

11 Claims, 8 Drawing Sheets

(56) References Cited

U.S. PATENT DOCUMENTS

| | | | |
|---|---|---|---|
| 6,115,319 A * | 9/2000 | Kinoshita et al. | 365/233.14 |
| 6,671,203 B2 * | 12/2003 | Tanzawa et al. | 365/185.11 |
| 6,816,421 B2 * | 11/2004 | Tanzawa et al. | 365/201 |
| 6,847,536 B1 | 1/2005 | Lee et al. | |
| 6,970,385 B2 * | 11/2005 | Sakakibara | 365/185.29 |
| 7,405,977 B2 * | 7/2008 | Lee et al. | 365/185.23 |
| 7,532,531 B2 * | 5/2009 | Lee | 365/218 |
| 7,813,184 B2 * | 10/2010 | Kim et al. | 365/185.29 |
| 7,817,470 B2 * | 10/2010 | Kim | 365/185.11 |
| 2004/0085835 A1 | 5/2004 | Ahn et al. | |

FOREIGN PATENT DOCUMENTS

| | | |
|---|---|---|
| CN | 101447223 | 6/2009 |
| KR | 20050010337 A | 1/2005 |
| KR | 20060068227 A | 6/2006 |
| KR | 20080040207 A | 5/2008 |

OTHER PUBLICATIONS

Office Action in CN Application No. 201010602426.6 dated Feb. 20, 2014.

* cited by examiner

SEMICONDUCTOR MEMORY APPARATUS

CROSS-REFERENCE TO RELATED APPLICATIONS

This is a division of U.S. application Ser. No. 12/973,000 filed Dec. 20, 2010, which claims the priority benefit under USC 119 of KR 2009-0129751 filed Dec. 23, 2009, the entire respective disclosures of which are incorporated herein by reference.

BACKGROUND

Exemplary embodiments relate generally to a semiconductor memory apparatus and a method of operating the same and, more particularly, to a semiconductor memory apparatus including a plurality of memory blocks and a method of operating the same.

A semiconductor memory apparatus performs one of program, read, and erase operations of selected memory cells in response to a row address and a column address.

More particularly, the semiconductor memory apparatus generally includes a plurality of memory blocks, and one of the plurality of memory blocks is selected in response to a block address included in the row address. Each of the memory blocks generally includes a plurality of word lines, and one of the plurality of word lines is selected in response to a word line address included in the row address. Furthermore, one or more of cells coupled to the selected word line are selected in response to the column address. The selected cells can include a memory cell, a redundancy cell, a repair cell, and a flag cell.

In cases where the semiconductor memory apparatus inputs and outputs data of 8 bytes, one memory block includes at least first to eighth I/O blocks. Furthermore, each of the I/O blocks includes 1024 bit lines (that is, 1024 columns). Accordingly, 8192 (1024×8) memory cells are coupled to one word line. If a large number of the memory cells are coupled to one word line as described above, the length of the word line can become long. Wirings to which voltages for the operations of memory cells are supplied are coupled to the word line. An operating voltage of a low level is supplied to a memory cell which is far from a portion where the word line and the wirings are coupled together because of the resistance component of the word line.

Furthermore, interference can be generated between the word line and the wirings according to the arrangement of the memory blocks and a row decoder for selecting one of the memory blocks. Consequently, the operating voltage supplied to the word line can be changed.

Meanwhile, with an increase of the number of memory blocks included in a semiconductor memory apparatus, the size of a row decoder for selecting one of the memory blocks is typically increased. If the area occupied by the row decoder is increased within a limited memory chip, the area where the memory blocks are formed is reduced, affecting the degree of integration.

BRIEF SUMMARY

Exemplary embodiments relate to a semiconductor memory apparatus and a method of operating the same, which are generally capable of reducing a difference in the level of an operating voltage supplied to memory cells coupled to a word line, reducing a shift in the operating voltage supplied to the word line because of interference between the word line and wirings, and reducing the size of a row decoder.

A semiconductor memory apparatus according to an aspect of the present disclosure comprises first and second memory blocks, first and second local line groups associated with each of the first and second memory blocks, wherein each of the first and second memory blocks comprise semiconductor elements coupled to their respective first and second local line groups, first and second global line groups, a first switching circuit configured to couple the first global line group to the first local line group of the first memory block in response to a block selection signal, a second switching circuit configured to couple the second global line group to the second local line groups of the first and second memory blocks in response to the block selection signal, and a third switching circuit configured to couple the first global line group to the first local line group of the second memory block in response to the block selection signal.

The first memory block can preferably be disposed between the first and second switching circuits, and the second memory block can preferably be disposed between the second and third switching circuits.

One of the first to third switching circuits can couple a global drain select line and a global source select line to a local drain select line and a local source select line of the first and second memory blocks. Preferably the first global line group comprises a first global dummy word line and a first global word line group, the second global line group comprises a second global dummy word line and a second global word line group, the first local line group comprises a first local dummy word line, and first local word lines, and the second local line group comprises a second local dummy word line and second local word lines.

A semiconductor memory apparatus according to another aspect of the present disclosure preferably comprises first and second memory banks each comprising a plurality of memory blocks, a voltage generation circuit configured to output first and second operating voltages to first and second global line groups in response to an operation command signal, a row decoder configured to output block selection signals for selecting a memory block from the first and second memory banks in response to a row address signal, a first switching circuit group configured to transfer the first operating voltages to a first memory block, selected from the first memory bank, in response to the block selection signals, a second switching circuit group configured to transfer the second operating voltages to the first memory block and a second memory block, selected from the second memory bank, in response to the block selection signals, and a third switching circuit group configured to transfer the first operating voltages to the second memory block in response to the block selection signals.

One of the first to third switching circuit groups can preferably couple a global drain select line and a global source select line to a local drain select line and a local source select line of the first and second memory banks.

The first memory bank can preferably be disposed between the first and second switching circuit groups, and the second memory bank can be disposed between the second and third switching circuit groups.

The semiconductor memory apparatus preferably further comprises block selection lines for transferring the block selection signals, generated by the row decoder, to the first to third switching circuit groups. The block selection lines preferably pass through or over a memory block adjacent to a memory block, disposed between the first and second switching circuits, from the first switching circuit of the first switching circuit group to the second switching circuit of the second switching circuit group. The block selection lines preferably pass through or over a memory block adjacent to a memory block, disposed between the second and third switching circuits, from the second switching circuit of the second switching circuit group to the third switching circuit of the third switching circuit group.

In the block selection lines, portions passing through horizontally to the local word lines of the memory block and portions passing through vertically to the local word lines of the memory block are preferably repeated over the memory block disposed between the first and second switching circuits and over the memory block disposed between the second and third switching circuits.

A semiconductor memory apparatus according to yet another aspect of the present disclosure preferably comprises first and second memory banks each comprising a plurality of memory blocks, a voltage generation circuit configured to output operating voltages in response to an operation command signal, a row decoder configured to output block selection signals for selecting a memory block from the first and second memory banks in response to a row address signal, and a switching circuit group configured to transfer the operating voltages to a first memory block, selected from the first memory bank, and a second memory block, selected from the second memory bank, in response to the block selection signals. The switching circuit group can be disposed between the first and second memory banks.

The semiconductor memory apparatus further preferably comprises block selection lines for transferring the block selection signals, generated by the row decoder, to the switching circuit group. One of the block selection lines used to select an even memory block of the memory blocks preferably passes through or over an odd memory block from the row decoder to the switching circuit group, and one of the block selection lines used to select an odd memory block of the memory blocks preferably passes through or over an even memory block from the row decoder to the switching circuit group.

The first memory block can preferably comprise some of first to eighth I/O memory blocks, a spare memory block, a repair memory block, and a flag cell block, and the second memory block can comprise memory blocks other than memory blocks included in the first memory block.

The first memory bank and the second memory bank preferably form one plane.

A semiconductor memory apparatus according to still yet another aspect of the present disclosure preferably comprises a memory bank comprising a plurality of memory blocks, a row decoder configured to output block selection signals in response to a row address, first and second switching circuits disposed on both sides of the memory blocks and configured to transfer operating voltages to a selected memory block in response to the block selection signals, and block selection lines configured to transfer the block selection signals to the first and second switching circuits. The block selection lines are disposed to pass through or over a memory block, neighboring a memory block disposed between the first and second switching circuits, between the first and second switching circuits.

In the block selection lines, portions passing through horizontally to the local word lines of the memory block and a portion passing through vertically to the local word lines of the memory block are repeated over the memory block.

A semiconductor memory apparatus according to further yet another aspect of the present disclosure preferably comprises a memory cell array comprising a plurality of memory blocks classified into a plurality of block groups, a first subdecoder configured to output a first selection signal for outputting one of the block groups in response to an enable signal and first row address signals, and a second subdecoder configured to output a second selection signal or a third selection signal for selecting one of a pair of even and odd memory blocks from a block group, selected by the first subdecoder, in response to the first selection signal and a second row address signal.

The first row address signals preferably comprise first signals generated by decoding a first block address signal used to classify the memory blocks into a plurality of first subblock groups, second signals generated by decoding a second block address signal used to classify the first subblock group into a plurality of second subblock groups, and three signals selected one by one from among third signals generated by decoding a third block address signal used to classify the second subblock group into a plurality of third subblock groups.

The second row address signal preferably comprises two fourth signals for selecting a pair of even and odd memory blocks from among fourth signals generated by decoding a fourth block address signal used to select a memory block from the third subblock group.

The semiconductor memory apparatus can further comprise a first output circuit for outputting an even block selection signal in response to the second selection signal and a second output circuit for outputting an odd block selection signal in response to the third selection signal. The first output circuit preferably outputs the even block selection signal having a higher voltage level than the second selection signal, and the second output circuit preferably outputs the odd block selection signal having a higher voltage level than the third selection signal.

The first and second subdecoders and the first and second output circuits are preferably provided in each pair of the even and odd memory blocks.

A method of operating a semiconductor memory apparatus according to still yet another aspect of the present disclosure preferably comprises providing the semiconductor memory apparatus according to the aspects of the present disclosure, precharging the local word lines of the memory blocks and then maintaining the local word lines in a floating state, and erasing the memory cells of the selected memory block by supplying an erase pulse to a substrate in the state in which a ground voltage is supplied to the local word lines of the selected memory block.

Local word lines included in unselected memory blocks of the memory blocks can preferably be precharged and then maintained in a floating state.

Alternatively, the local word lines of all the memory blocks can preferably be precharged and then maintained in a floating state, and the local word lines of the selected memory block can be discharged to a ground voltage supplied for an erase operation.

DESCRIPTION OF EMBODIMENTS

Hereinafter, some exemplary embodiments of the present disclosure will be described in detail with reference to the accompanying drawing figures. The drawing figures are provided to allow those having ordinary skill in the art to understand the scope of the embodiments of the disclosure.

Figure 1:
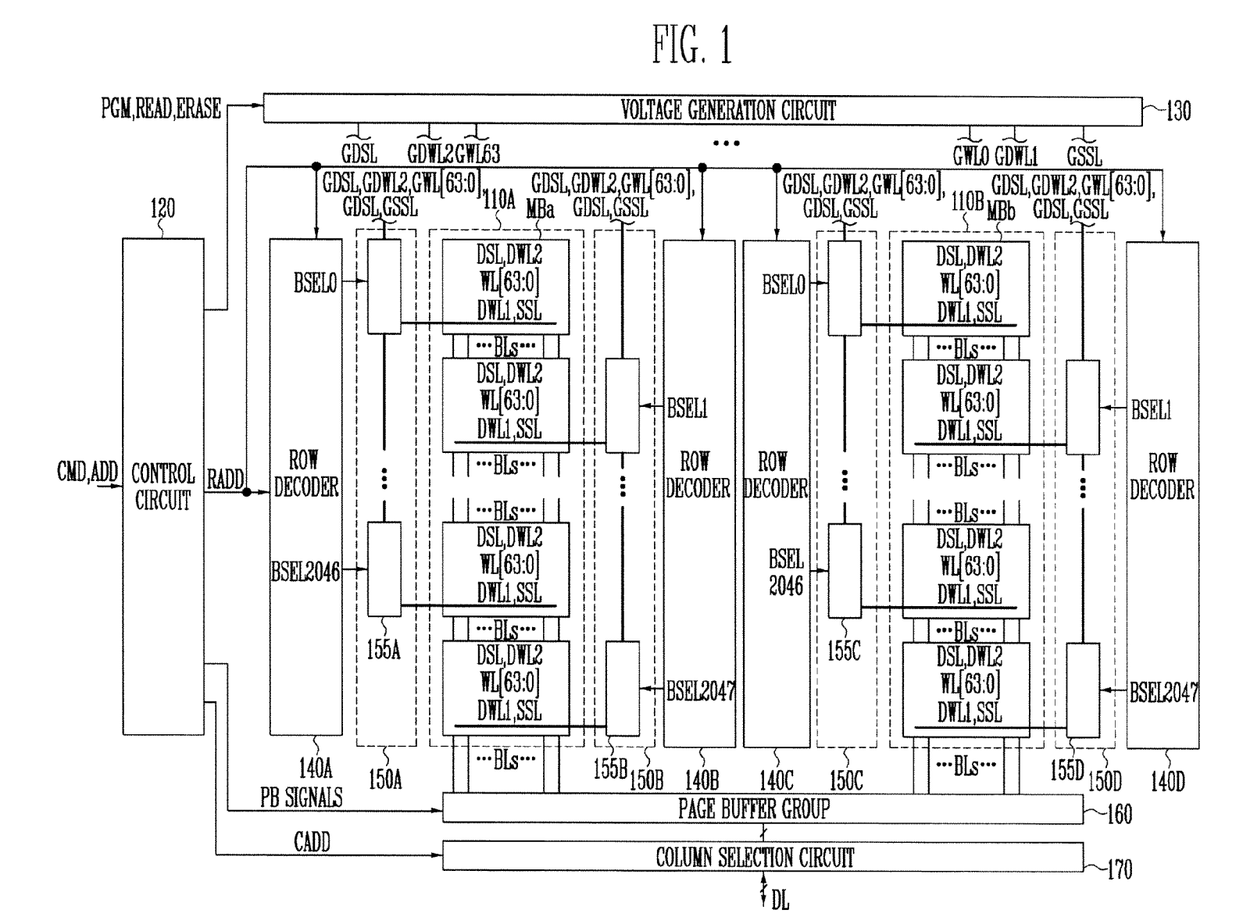
FIG. 1 is a diagram showing a semiconductor memory apparatus according to an exemplary embodiment of this disclosure.

FIG. 1 is a diagram showing a semiconductor memory apparatus according to an exemplary embodiment of this disclosure.

Referring to FIG. 1, the semiconductor memory apparatus includes a memory plane, a control circuit 120, a voltage generation circuit 130, row decoders 140A, 140B, 140C, and 140D, switching circuit groups 150A, 150B, 150C, and 150D, a page buffer group 160, and a column selection circuit 170.

The memory plane includes a first memory bank 110A and a second memory bank 110B. The first memory bank 110A and the second memory bank 110B include a plurality of memory blocks MBa, MBb. Each of the memory blocks includes a plurality of semiconductor elements coupled to local lines DSL, DWL2, WL[63:0], DWL1, and SSL. More particularly, the memory blocks include source select transistors (not shown) coupled to a local source select line SSL, memory cells (not shown) coupled to a first local dummy word line DWL1, memory cells (not shown) coupled to a plurality of word lines WL[63:0], memory cells (not shown) coupled to a second local dummy word line DWL2, and drain select transistors (not shown) coupled to a local drain select line DSL. The above memory block is known in NAND flash memory devices. However, the structure of the memory block can be changed according to the type of memory device.

In cases where a semiconductor memory apparatus inputs and outputs data of 8 bytes, at least 8 I/O blocks are included in one memory block. Each of the I/O blocks includes at least 1024 columns BLs (that is, bit lines). Accordingly, one memory block includes a total of at least 8192 columns. In cases where the memory blocks further include a repair block (not shown), including repair columns for replacing failed columns included in the I/O block, and a spare block (not shown) or a flag block (not shown) for storing status information of the I/O block, the number of columns is further increased.

In this disclosure, half of all the columns can be disposed in the first memory block MBa, and the remaining half of the columns can be disposed in the second memory block MBb. In this case, there is an advantage in that one memory block can be divided into two memory blocks. That is, there is an advantage in that one plane including a plurality of memory blocks is divided into two planes. If one memory block is divided into two memory blocks, one local word line is divided into two, and an increase of a resistance component, increasing with an increase of the local word line, can be reduced at least by half. Since the memory block is divided into two, the constructions and the connection relationships of row decoders and switching circuit groups are changed.

The control unit 120 internally outputs a program signal PGM, a read signal READ, or an erase signal ERASE in response to a command signal CMD and outputs control signals PB SIGNALS for controlling internal circuits, such as the page buffer group 160. Furthermore, the control unit 120 internally outputs a row address signal RADD and a column address signal CADD in response to an address signal ADD.

The voltage generation circuit 130 outputs operating voltages for programming, reading, or erasing memory cells to global lines GSSL, GDWL1, GWL[63:0], GDWL2, and GDSL in response to the internal command signal PGM, READ, or ERASE of the control circuit 120. The global lines include a global source select line GSSL, a first global dummy word line GDWL1, a plurality of global word lines GWL[63:0], a second global dummy word line GDWL2, and a global drain select line GDSL.

The row decoders 140A, 140B, 140C, and 140D output block selection signals BSEL0 to BSEL2047 for selecting one of the plurality of memory blocks in response to the row address signal RADD of the control circuit 120. Furthermore, the switching circuit groups 150A, 150B, 150C, and 150D couple the global lines GSSL, GDWL1, GWL[63:0], GDWL2, and GDSL to the local lines DSL, DWL2, WL[63:0], DWL1, and SSL of a selected memory block in response to the block selection signals BSEL0 to BSEL2047. That is, the switching circuit groups 150A, 150B, 150C, and 150D transfer operating voltages, generated by the voltage generation circuit 130, to a selected memory block in response to the block selection signals BSEL0 to BSEL2047.

Meanwhile, as one memory plane is divided into the two memory banks 110A, 110B, the constructions and the connection relationships of the row decoders and the switching circuit groups are also changed.

More particularly, the first and second switching circuit groups 150A, 150B are disposed on both sides of the first memory bank 110A, and the third and fourth switching circuit groups 150C, 150D are disposed on both sides of the second memory bank 110B. Furthermore, the first row decoder 140A for controlling the operation of the first switching circuit group 150A, the second row decoder 140B for controlling the operation of the second switching circuit group 150B, the third row decoder 140C for controlling the operation of the third switching circuit group 150C, and the fourth row decoder 140D for controlling the operation of the fourth switching circuit group 150D, in response to the row address signal RADD, are disposed as follows. The first row decoder 140A can be disposed on one side of the first switching circuit group 150A, the second and third row decoders 140B, 140C can be disposed between the second and third switching circuit groups 150B, 150C, and the fourth row decoder 140D can be disposed on the other side of the fourth switching circuit group 150D.

The first switching circuit group 150A includes switching circuits 155A for coupling the local lines DSL, DWL2, WL[63:0], DWL1, and SSL of even memory blocks, from among the memory blocks included in the first memory bank 110A, to the global lines GSSL, GDWL1, GWL[63:0], GDWL2, and GDSL. Accordingly, the first row decoder 140A outputs the even block selection signals BSEL0 to BSEL2046 for selecting the even memory blocks, from among the block selection signals BSEL0 to BSEL2047. Accordingly, the first row decoder 140A can be classified as an even row decoder, and the first switching circuit group 150A can be classified as an even switching circuit group.

The second switching circuit group 150B includes switching circuits 155B for coupling the local lines DSL, DWL2, WL[63:0], DWL1, and SSL of odd memory blocks, from among the memory blocks included in the first memory bank 110A, to the global lines GSSL, GDWL1, GWL[63:0], GDWL2, and GDSL. Accordingly, the second row decoder 140B outputs the odd block selection signals BSEL1 to BSEL2047 for selecting the odd memory blocks, from among the block selection signals BSEL0 to BSEL2047. Accordingly, the second row decoder 140B can be classified as an odd row decoder, and the second switching circuit group 150B can be classified as an odd switching circuit group.

The third and fourth switching circuit groups 150C, 150D and the third and fourth row decoders 140C, 140D are operated in the same manner in relation to the memory blocks MBb of the second memory bank 110B.

The page buffer group 160 includes page buffers coupled to bit lines BLs. The page buffer group 160 supplies voltage necessary to store data in a memory cell to the bit line BLs or stores data from a memory cell through the bit line BLs in response to the control signals PB SIGNALS of the control unit 120.

The column selection circuit 170 selects a page buffer coupled to a column (i.e., bit line), selected by the page buffer group 160, in response to the column address signal CADD of the control circuit 120 and outputs data, stored in the selected page buffer, to a data line DL. Here, in cases where 8 I/O blocks are included in the memory banks 110A, 110B, one column is selected from each of the I/O blocks. Accordingly, the page buffer group 160 selects 8 page buffers in response to the column address signal CADD at the same time, and so data of 1 byte is output to the data line DL.

In the above-described semiconductor memory apparatus, one memory block is divided into the two memory blocks MBa, MBb. Thus, the length of a word line is reduced by half, and the number of memory cells coupled to the word line is reduced by half. Accordingly, a resistance component of the word line proportional to the length of the word line is reduced, and a reduction of an operating voltage supplied to a memory cell via the word line can be reduced.

Meanwhile, since one memory block is divided into two memory blocks, the four row decoders 140A, 140B, 140C, and 140D and the four switching circuit groups 150A, 150B, 150C, and 150D are required. As the number of row decoders and switching circuit groups is increased as described above, the area occupied by the row decoders and the switching circuit groups is increased, but the area occupied by the memory banks 110A, 110B is relatively reduced.

A method of solving the above problem is described below.

A region in which the first switching circuit group 150A corresponding to an even switching circuit group and a region in which the second switching circuit group 150B corresponding to an odd switching circuit group are exchanged. Furthermore, the second row decoder 140B corresponding to an odd row decoder is disposed instead of the first row decoder 140A. Thus, only the first and second even switching circuit groups 150A, 150C are disposed between the first and second memory banks 110A, 110B, and only one even row decoder 140C is disposed between the even switching circuit groups 150A, 150C. If the even switching circuit groups 150A, 150C are simultaneously controlled by the one even row decoder 140C, the number of row decoders can be reduced because the first row decoder 140A is not necessary.

For another example, the positions of the third and fourth switching circuit groups 150C, 150D may be exchanged, and the fourth row decoder 140D corresponding to an odd row decoder may be disposed instead of the third row decoder 140C. In this case, if the second row decoder 140B controls the second and fourth switching circuit groups 150B, 150D at the same time, the number of row decoders can be reduced because the third row decoder 140C is not necessary.

Although at least four switching circuit groups and at least three row decoders are included in the above example, a method of further reducing the number of switching circuit groups and row decoders is described below.

Figure 2A:
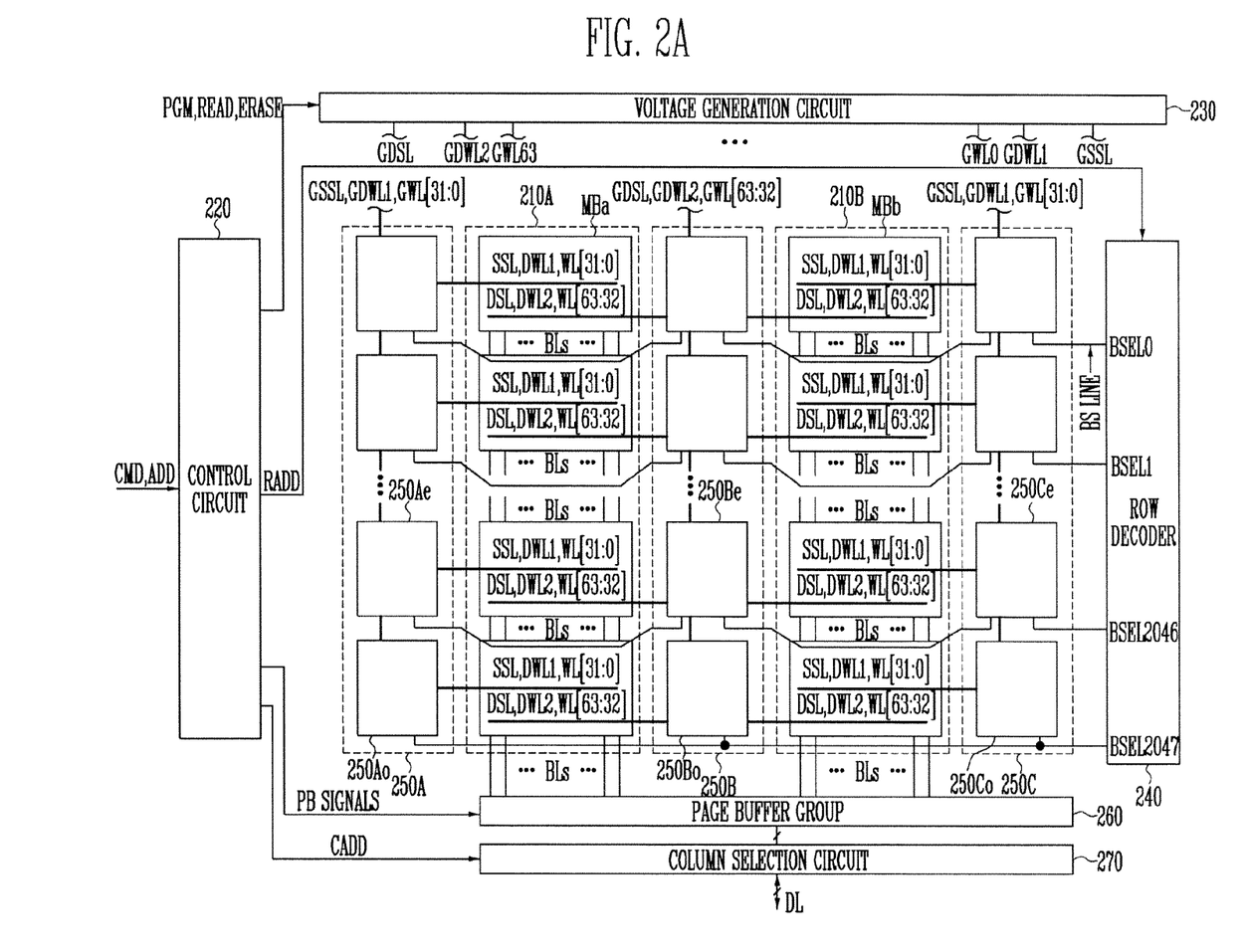
FIGS. 2A to 2C are diagram showing a semiconductor memory apparatus according to another exemplary embodiment of this disclosure.
Figure 2B:
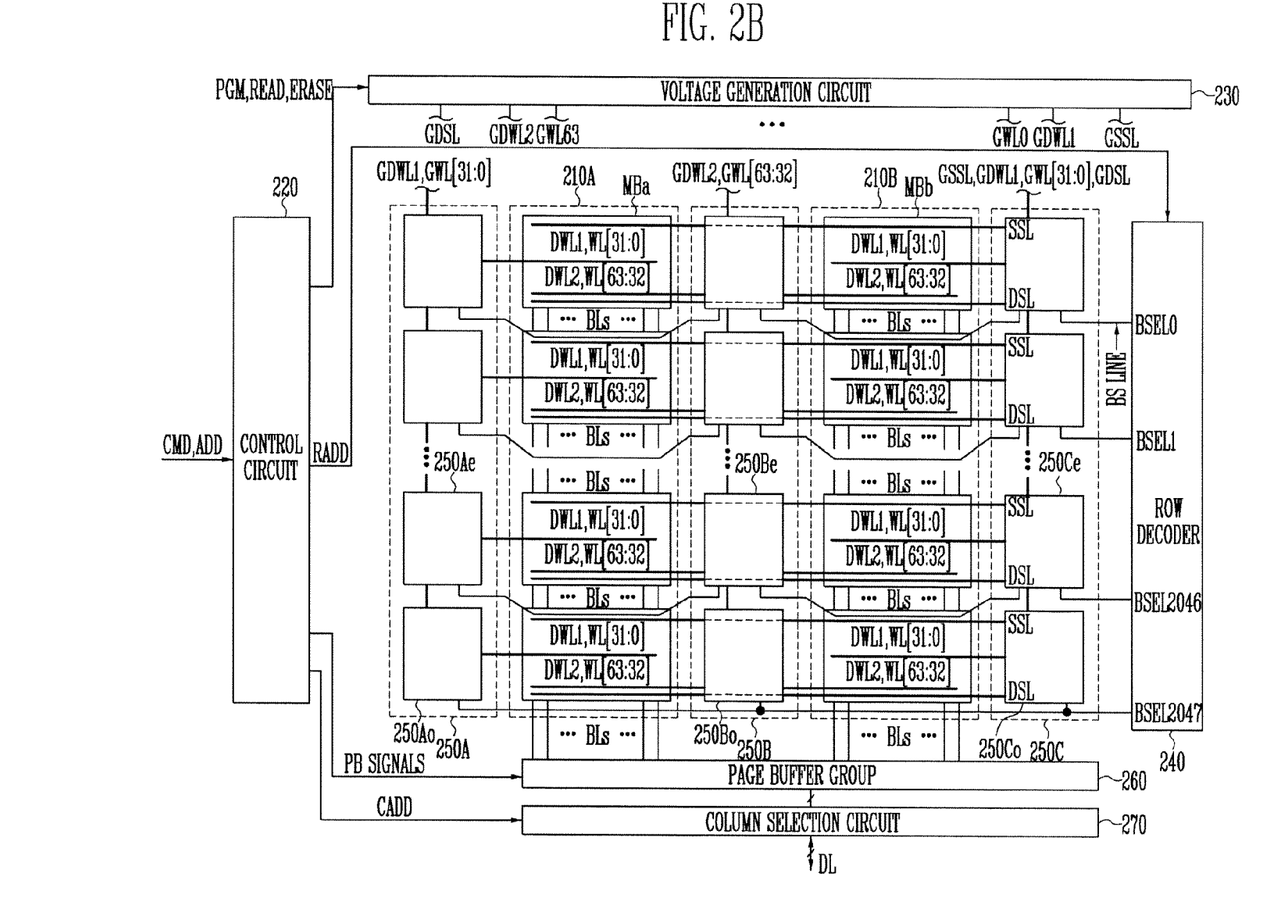
Figure 2C:
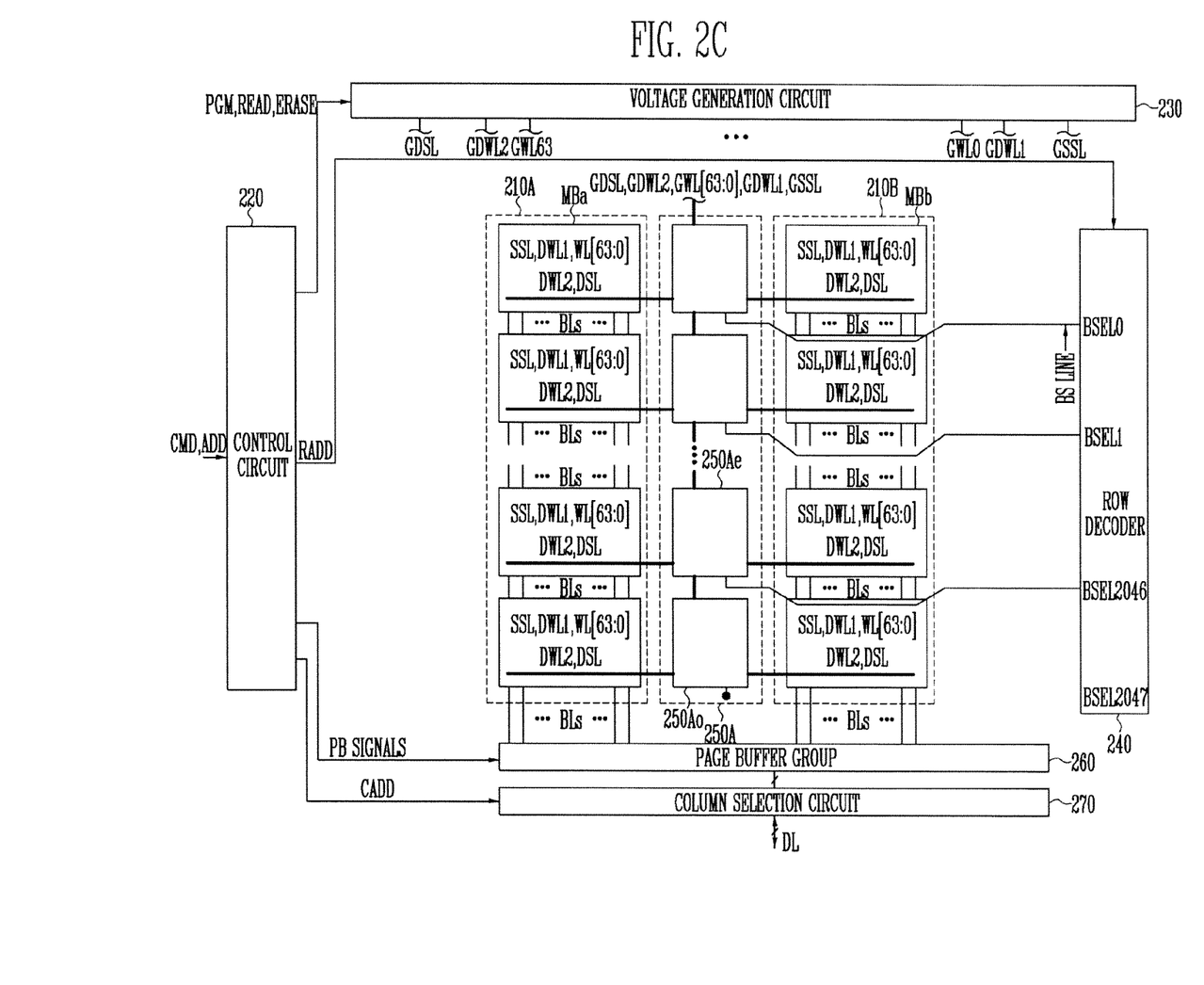

FIGS. 2A to 2C are diagrams showing a semiconductor memory apparatus according to another exemplary embodiment of this disclosure.

Referring to FIG. 2A, the semiconductor memory apparatus includes a memory plane, a control circuit 220, a voltage generation circuit 230, a row decoder 240, switching circuit groups 250A, 250B, and 250C, a page buffer group 260, and a column selection circuit 270.

Two memory banks 210A, 210B included in one memory plane, the control circuit 220, the voltage generation circuit 230, the page buffer group 260, and the column selection circuit 270 are the same as the memory banks 110A, 110B, the control unit 120, the voltage generation circuit 130, the page buffer group 160, and the column selection circuit 170 described with reference to FIG. 1, and a description thereof is omitted.

In the present embodiment, a structure in which the local lines DSL, DWL2, WL[63:0], DWL1, and SSL of memory blocks MBa, MBb are coupled to global lines GSSL, GDWL1, GWL[63:0], GDWL2, GDSL through the switching circuit groups 250A, 250B, and 250C is changed. The switching circuit groups 250A, 250B, and 250C are controlled by one row decoder 240.

More particularly, the row decoder 240 outputs block selection signals BSEL0 to BSEL2047 for selecting one of the plurality of memory blocks in response to the row address signals RADD of the control circuit 220.

The first switching circuit group 250A is disposed on one side of the first memory bank 210A. The second switching circuit group 250B is disposed between the first and second memory banks 210A, 210B. Furthermore, the third switching circuit group 250C is disposed on the other side of the second memory bank 210B. Here, the row decoder 240 is adjacent to the first switching circuit group 250A or the third switching circuit group 250C.

The first switching circuit group 250A includes a plurality of switching circuits 250Ae, 250Ao. The first switching circuit group 250A couples some (for example, GSSL, GDWL1, and GWL[31:0]) of global lines GSSL, GDWL1, GWL[63:0], GDWL2, and GDSL to some (for example, SSL, DWL1, and WL[31:0]) of the local lines DSL, DWL2, WL[63:0], DWL1, and SSL of a memory block MBa, selected from the first memory bank 210A, in response to the block selection signals BSEL0 to BSEL2047 of the row decoder 240. That is, the first switching circuit group 250A transfers some of operating voltages, generated by the voltage generation circuit 230, to the selected memory block MBa of the first memory bank 210A in response to the block selection signals BSEL0 to BSEL2047.

The second switching circuit group 250B includes a plurality of switching circuits 250Be, 250Bo. The second switching circuit group 250B couples the remaining ones (for example, GWL[32:63], GDWL2, and GDSL) of the global lines GSSL, GDWL1, GWL[63:0], GDWL2, and GDSL to some (for example, DSL, DWL2, and WL[63:32]) of the local lines DSL, DWL2, WL[63:0], DWL1, and SSL of the memory blocks MBa, MBb, selected from the first and second memory banks 210A, 210B, in response to the block selection signals BSEL0 to BSEL2047 of the row decoder 240. That is, the second switching circuit group 250B transfers some of the operating voltages, generated by the voltage generation circuit 230, to the memory blocks MBa, MBb selected from the first and second memory banks 210A, 210B in response to the block selection signals BSEL0 to BSEL2047.

The third switching circuit group 250C includes a plurality of switching circuits 250Ce, 250Co. The third switching circuit group 250C couples some (for example, GSSL, GDWL1, and GWL[31:0]) of the global lines GSSL, GDWL1, GWL[63:0], GDWL2, and GDSL to some (for example, SSL, DWL1, and WL[31:0]) of the local lines DSL, DWL2, WL[63:0], DWL1, and SSL of the memory block MBb, selected from the second memory bank 210B, in response to the block selection signals BSEL0 to BSEL2047 of the row decoder 240. That is, the third switching circuit group 250C transfers some of the operating voltages, generated by the voltage generation circuit 230, to the memory block MBb selected from the second memory bank 210B in response to the block selection signals BSEL0 to BSEL2047.

As another example, the first switching circuit group 250A can couple the global lines GDSL, GDWL2, and GWL[63:32] to the local lines DSL, DWL2, and WL[63:32] of the memory block MBa selected from the first memory bank 210A. The second switching circuit group 250B can couple the global lines GSSL, GDWL1, and GWL[31:0] to the local lines SSL, DWL1, and WL[31:0] of the memory blocks MBa, MBb selected from the first and second memory banks 210A, 210B. Furthermore, the third switching circuit group 250C can couple the global lines GDSL, GDWL2, and GWL[63:32] to the local lines DSL, DWL2, and WL[63:32] of the memory block MBb selected from the second memory bank 210B.

As yet another example, referring to FIG. 2B, one (for example, 250C) of the first to third switching circuit groups 250A, 250B, and 250C may couple the global drain select line GDSL and the global source select line GSSL to the local drain select line DSL and the source select line SSL of memory blocks selected from the first and second memory banks 210A, 210B. In this case, the remaining switching circuit groups 250A, 250B couple the remaining global lines GDWL2, DWL[63:0], and GDWL1 to the remaining local lines DWL2, WL[63:0], and DWL1.

Although the three switching circuit groups 250A, 250B, and 250C are used in the above examples, only one switching circuit group 250A need be used.

Referring to FIG. 2C, global lines GSSL, GDWL1, GWL[63:0], GDWL2, and GDSL may be coupled to the local lines DSL, DWL2, WL[63:0], DWL1, and SSL of memory blocks MBa, MBb selected from first and second memory banks 210A, 210B by using only one switching circuit group 250A disposed between first and second memory banks 210A, 210B.

Accordingly, the operating voltages can be transferred from the voltage generation circuit 230 to the memory blocks MBa, MBb of the first and second memory banks 210A, 210B by using a small number of switching circuit groups and row decoders.

Meanwhile, the block selection signal BSEL0 output by the row decoder 240 is transferred to the first to third switching circuit groups 250A, 250B, and 250C through block selection lines BS LINE.

In a NAND flash memory device, bit lines are disposed vertically to word lines over the word lines. Here, it is preferred that the block selection lines BS LINE be electrically isolated from the bit lines and the word lines and disposed between the bit lines and the word lines.

When a program operation is performed, the block selection line BS LINE transmits the block selection signal BSEL0 of about 20 V. In cases where the block selection line BS LINE passes through or over the memory block MBb disposed between the second and third switching circuit groups 250B, 250C from the third switching circuit group 250C to the second switching circuit group 250B, interference can be generated in local word lines disposed under the block selection line BS LINE, from among the local word lines WL[63:0] of the memory block MBb, because of the block selection signal BSEL0 of a high level transmitted through the block selection line BS LINE. That is, the levels of operating voltages supplied to the local word lines disposed under the block selection line BS LINE can be changed because of the block selection signal BSEL0, thereby generating operational errors. This problem can be solved as follows.

Figure 3:
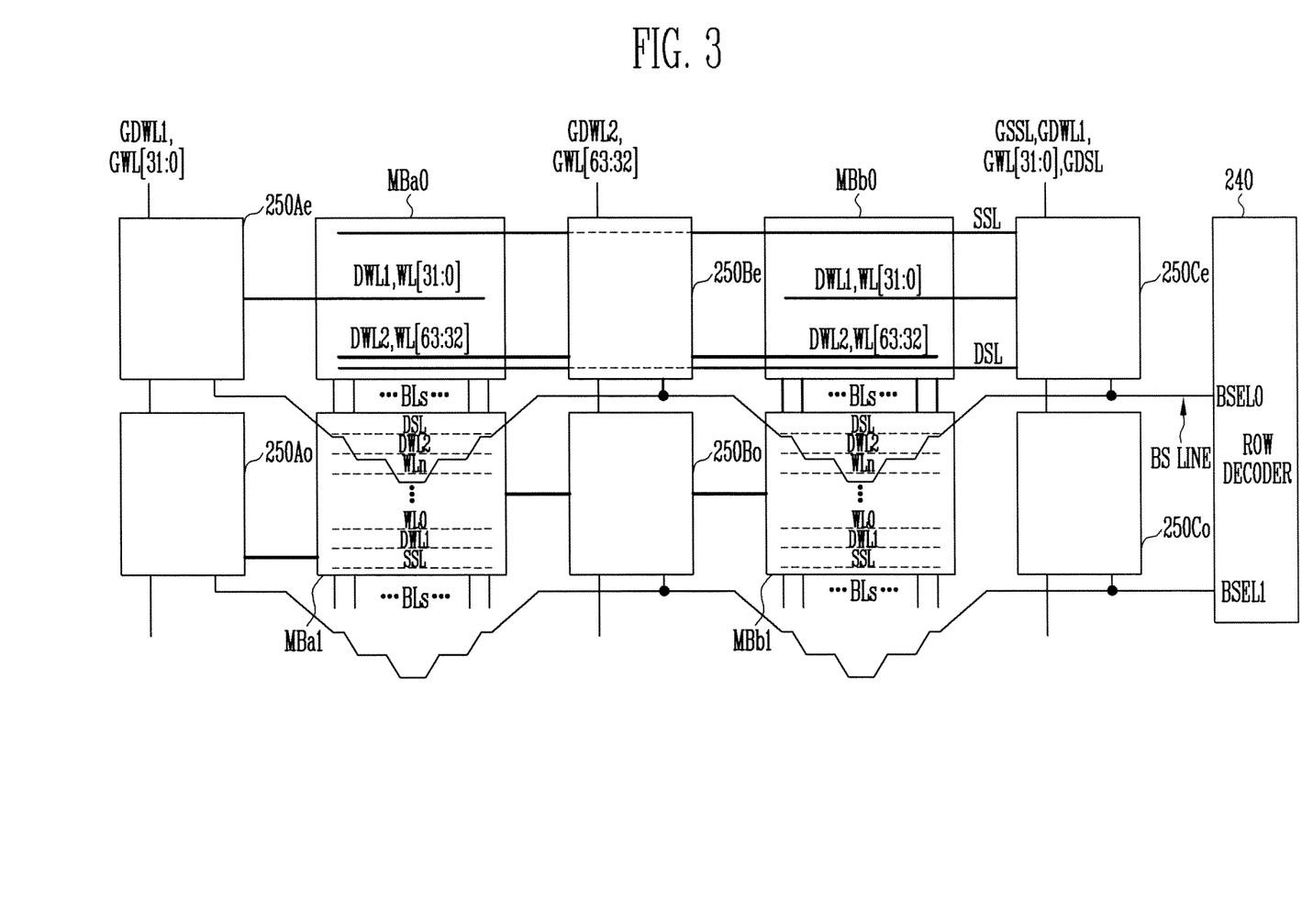
FIG. 3 is a block diagram showing part of the semiconductor memory apparatus according to another exemplary embodiment of this disclosure.
Figure 4:
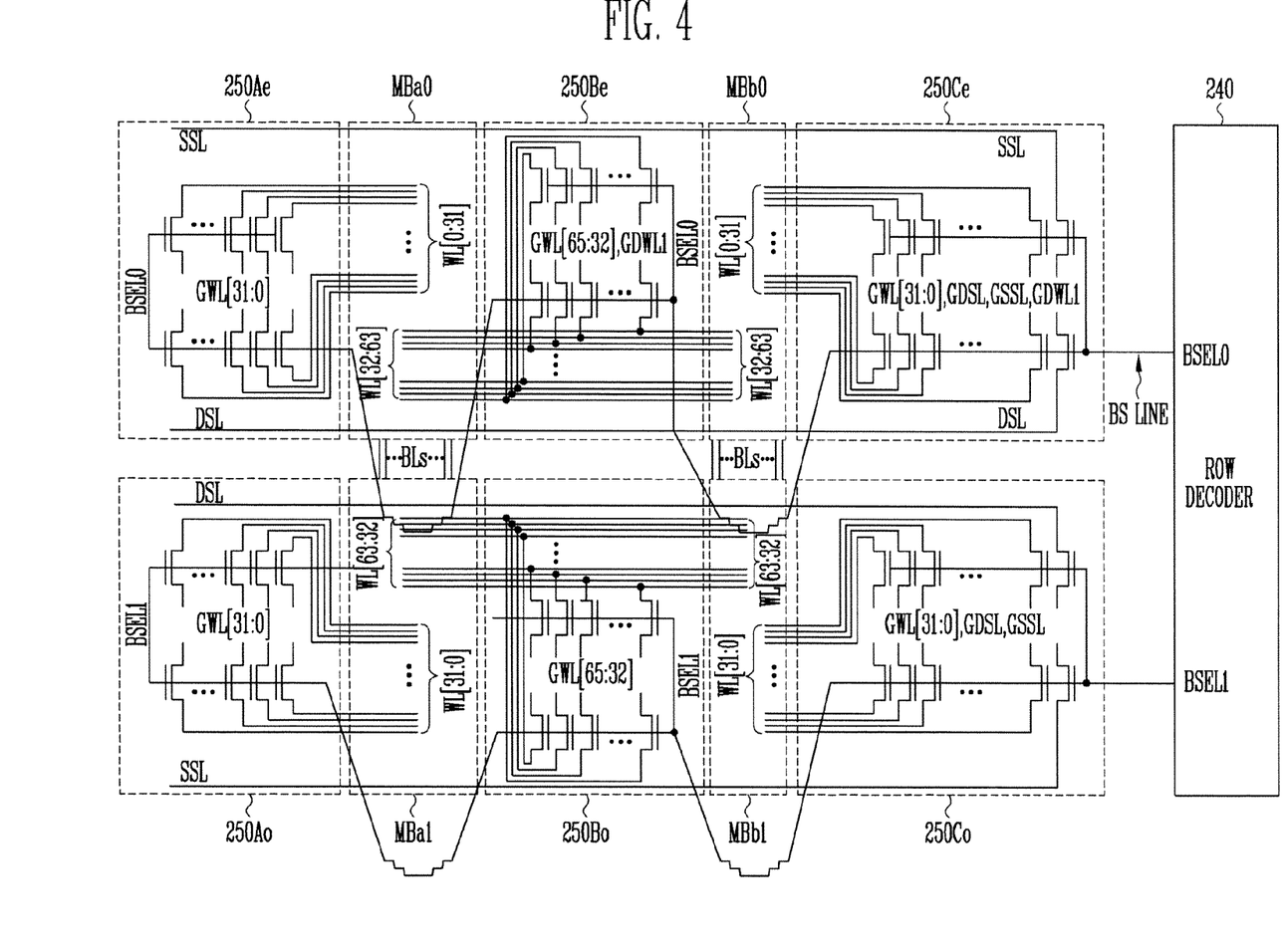
FIG. 4 is a circuit diagram showing part of the semiconductor memory apparatus according to another exemplary embodiment of this disclosure.

FIG. 3 is a block diagram showing part of the semiconductor memory apparatus shown in FIG. 2B. FIG. 4 is a circuit diagram showing part of the semiconductor memory apparatus according to another exemplary embodiment of this disclosure.

Referring to FIGS. 3 and 4, the even memory block MBa0 of a first memory bank is disposed between the first even switching circuit 250Ae of a first switching circuit group and the second even switching circuit 250Be of a second switching circuit group, and the odd memory block MBa1 of the first memory bank is disposed between the first odd switching circuit 250Ao of the first switching circuit group and the second odd switching circuit 250Bo of the second switching circuit group. Furthermore, the even memory block MBb0 of a second memory bank is disposed between the second even switching circuit 250Be of the second switching circuit group and the third even switching circuit 250Ce of a third switching circuit group, and the odd memory block MBb1 of the second memory bank is disposed between the second odd switching circuit 250Bo of the second switching circuit group and the third odd switching circuit 250Co of the third switching circuit group.

In the above, some of first to eighth I/O memory blocks, a spare memory block, a repair memory block, and a flag cell block can be included in the memory blocks of the first memory bank, and the remaining memory blocks not included in the first memory blocks of the first memory bank can be included in the memory blocks of the second memory bank.

Each of the switching circuits includes switching elements (that is, transistors) for coupling the global lines GSSL, GDWL1, GWL[63:0], GDWL2, and GDSL to the respective local lines DSL, DWL2, WL[63:0], DWL1, and SSL in response to the block selection signal.

The first to third even switching circuits 250Ae, 250Be, and 250Ce are operated in response to the block selection signal BSEL0 received from the row decoder 240 through the block selection line BS LINE. When the block selection line BS LINE passes through or over the memory blocks MBa0, MBb0, voltage supplied to the local lines disposed under the block selection line BS LINE is changed because of capacitance coupling due to capacitance between the block selection line BS LINE and some of the local lines WL[63:0] of the memory blocks MBa0, MBb0.

In order to solve the problem, the route of the block selection line BS LINE is changed so that the block selection line BS LINE passes through or over a memory block, neighboring a memory block disposed between the switching circuits, between the switching circuits. For example, the route of the block selection line BS LINE can be set up so that the block selection line BS LINE passes through or over the memory block MBa1, neighboring the memory block MBa0 disposed between the first and second even switching circuits 250Ae, 250Be, between the first and second even switching circuits 250Ae, 250Be. For example, the route of the block selection line BS LINE can be set up so that the block selection line BS LINE passes through or over the memory block MBb1, neighboring the memory block MBb0 disposed between the second and third even switching circuits 250Be, 250Ce, between the second and third even switching circuits 250Be, 250Ce.

Although the even memory block MBa0 is selected and the odd memory block MBa1 is not selected, voltage supplied to local word lines disposed under the block selection line BS LINE, from among the local word lines WL[63:0] of the unselected memory block MBa1, can be changed because of the block selection signal BSEL0 of a high voltage supplied to the block selection line BS LINE passing through or over the unselected memory block MBa1. Consequently, electrical characteristics (for example, threshold voltage) of memory cells can be changed. Such a phenomenon is increased with an increasing area in which the block selection line BS LINE overlaps with the local word lines. Accordingly, in order to minimize the area in which the block selection line BS LINE overlaps with the local word lines, it is preferred that the route of the block selection line BS LINE be set up meanderingly (that is, in zigzags) over the neighboring memory block MBa1. More particularly, the route of the block selection line BS LINE is set up such that a portion passing through horizontally to the local word lines WL[63:0] of the memory block MBa1 and a portion passing through vertically to the local word lines WL[63:0] of the memory block MBa1, are repeated over the memory block MBa1. It is preferred that the route of the block selection line BS LINE be set up so that the portion passing through vertically to the local word lines WL[63:0] is repeated for every 1500 to 2500 columns (that is, bit lines).

In this case, although the block selection line BS LINE passes through or over the neighboring memory block MBa1, interference can be minimized.

Meanwhile, since the block selection line BS LINE passes through or over a memory block, the local word lines of an unselected memory block may not rise up to a target voltage when an erase operation is performed. For example, when the erase operation is performed, a ground voltage (for example, 0 V) can be supplied to the local word lines of a selected memory block and the local word lines of an unselected memory block can be set in a floating state. Furthermore, when an erase voltage is supplied to a substrate (or P well), memory cells coupled to the local word lines of the selected memory block are erased. Here, a potential of the local word lines of the unselected memory block have to rise up to 15 V to 20 V because of capacitance coupling generated by the erase voltage. Meanwhile, for example, in cases where an erase operation is performed in the state where both the memory blocks MBa0, MBa1 are not selected, but a memory block (not shown) is selected, 0 V can be supplied to the block selection line BS LINE passing through or over the memory block MBa1. The voltage 0 V supplied to the block selection line BS LINE hinders voltage of the local word lines of the memory block MBa1 from rising. For this reason, since a potential of the local word lines WL[63:0] of the unselected memory block MBa1 is not sufficiently high, memory cells coupled to the local word lines WL[63:0] of the unselected memory block MBa1 can be erased.

In order to solve the problem, when an erase signal is inputted, the local word lines WL[63:0] of the memory blocks are precharged to 0.5 V to 6 V and then maintained in a floating state, before an erase pulse for an erase operation is supplied to the substrate (or P well). Furthermore, in response to the block selection signals generated by the row decoder, voltage precharged to the local word lines of a selected memory block is discharged, and the local word lines of an unselected memory block is maintained in a floating state. In other words, the ground voltage 0 V is supplied to the local word lines of the selected memory block. Here, only the local word lines of the unselected memory blocks can be selectively precharged. Next, the erase pulse for the erase operation is supplied to the substrate (or P well).

In this case, although the voltage 0 V supplied to the block selection line BS LINE hinders voltage of the local word lines from rising, voltage of the local word lines WL[63:0] can be raised up to a target voltage because the erase operation is performed with the local word lines WL[63:0] being precharged to 0.5 V to 6 V.

In the above case, the number of switching circuit groups is increased because the memory block is divided and so the area in which memory blocks will be formed can be reduced. For the above reason, the design of the row decoders is changed in order to reduce the area occupied by the row decoders. This is described in more detail below.

Figure 5:
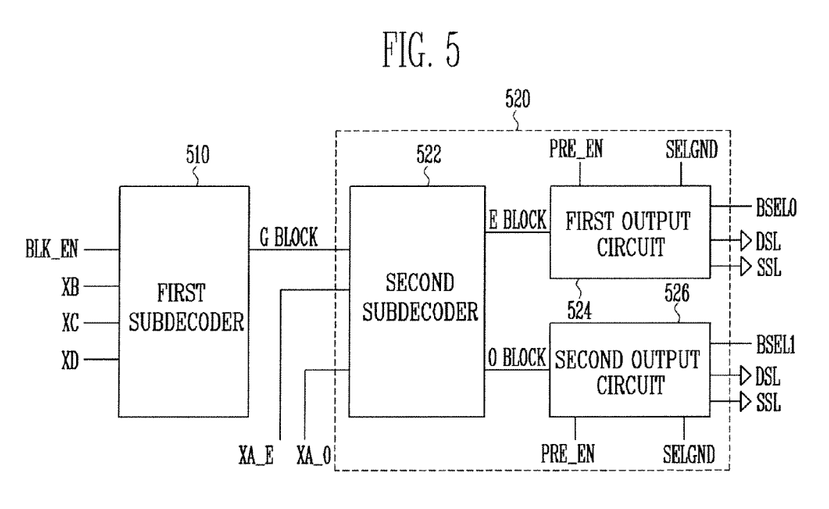
FIG. 5 is a block diagram of a semiconductor memory apparatus including a row decoder according to an exemplary embodiment of this disclosure.

FIG. 5 is a block diagram of a semiconductor memory apparatus including a row decoder according to an exemplary embodiment of this disclosure.

Referring to FIG. 5, the semiconductor memory apparatus includes a memory cell array (not shown), including a plurality of memory blocks, and the row decoder. The memory cell array includes the plurality of memory blocks, which can be classified into a plurality of block groups.

Here, the row decoder includes a first subdecoder 510 and a second subdecoder 522. The first subdecoder 510 is configured to output a first selection signal G BLOCK for selecting one of the block groups of the memory cell array in response to an enable signal BLK_EN and first row address signals XB, XC, and XD.

The second subdecoder 522 is configured to output a second selection signal E BLOCK or a third selection signal O BLOCK for selecting one of a pair of even and odd memory blocks from a block group, selected by the first subdecoder 510, in response to the first selection signal G BLOCK and second row address signals XA_E, XA_O.

The first row address signals include first signals, second signals, and three signals XB, XC, and XD. The second signals are generated by decoding first block address signals ADD[21:23] used to classify memory blocks into a plurality of first subblock groups. The second signals are generated by decoding second block address signals ADD[24:26] used to classify the first subblock groups into a plurality of second subblock groups. The three signals XB, XC, and XD are selected one by one from among third signals which are generated by decoding third block address signals ADD[27:29] used to classify the second subblock groups into a plurality of third subblock groups. Furthermore, the second row address signals XA_E, XA_O include the two fourth signals XA_E, XA_O used to select a pair of even and odd memory blocks and selected from among fourth signals. Here, the fourth signals are generated by decoding fourth block address signals ADD[30:32] used to select a memory block from the third subblock groups. Such a signal relationship can be changed according to the details of the design, such as the number of memory blocks.

Furthermore, the semiconductor memory apparatus of FIG. 5 can further include a first output circuit 524 for outputting an even block selection signal BSEL0 in response to the second selection signal E BLOCK and a second output circuit 526 for outputting an odd block selection signal BSEL1 in response to the third selection signal O BLOCK.

The first output circuit 524 outputs the even block selection signal BSEL0 having a higher voltage level than the second selection signal E BLOCK. The second output circuit 526 outputs the odd block selection signal BSEL1 having a higher voltage level than the third selection signal O BLOCK.

The first and second subdecoders 510, 522, and the first and second output circuits 524, 526 are provided in each pair of even and odd memory blocks. Furthermore, the second subdecoder 522 and the first and second output circuits 524, 526 construct even/odd decoder 520 for selecting an even memory block or an odd memory block, from among the pair of even and odd memory blocks of a selected memory block.

The circuit construction and operation of the above-described row decoder is described in more detail below.

Figure 6:
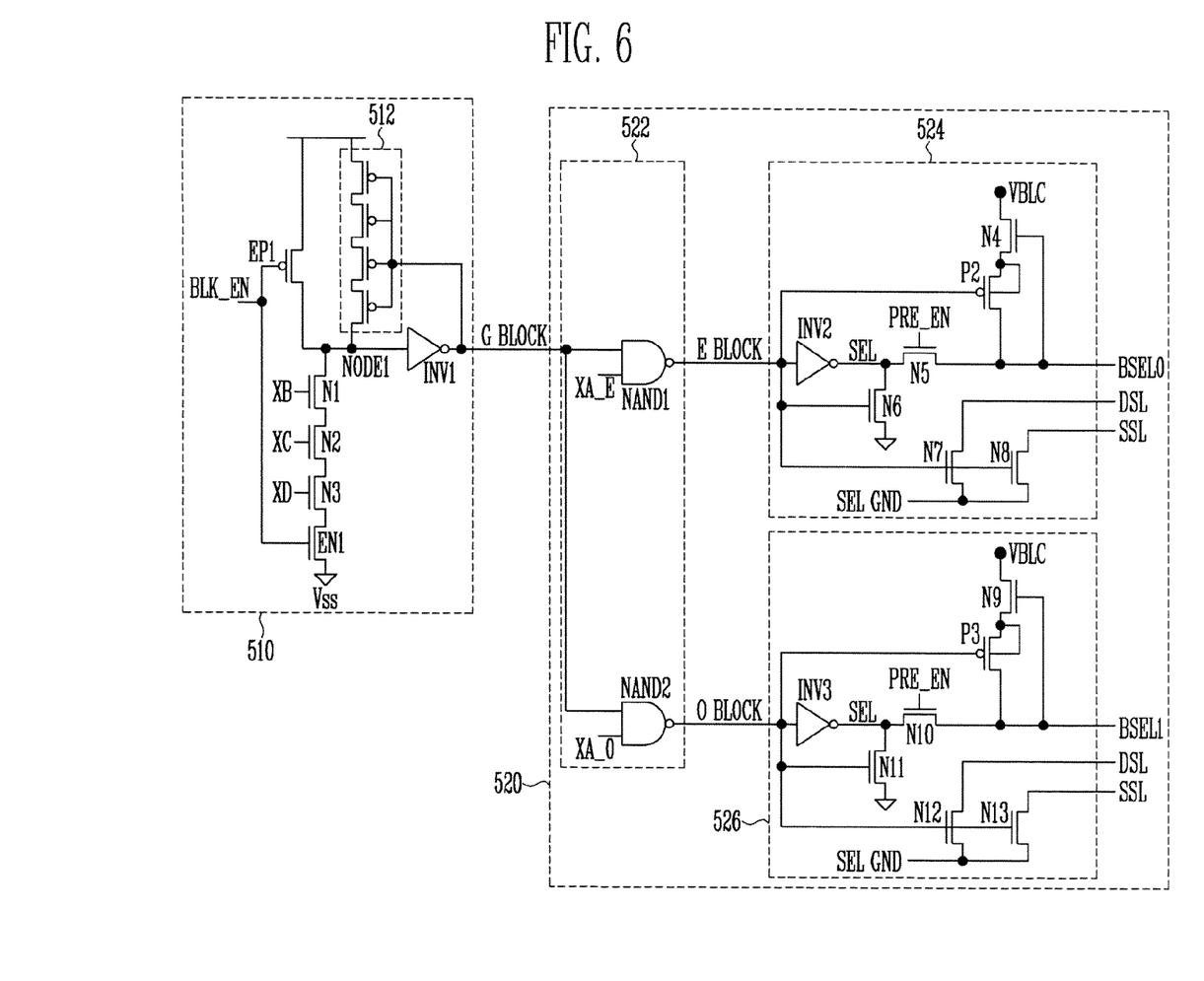
FIG. 6 is a circuit diagram of the semiconductor memory apparatus including the row decoder according to an exemplary embodiment of this disclosure.

FIG. 6 is a circuit diagram of the semiconductor memory apparatus including the row decoder according to an exemplary embodiment of this disclosure.

Referring to FIG. 6, the first subdecoder 510 includes a first transistor EP1, a second transistor EN1, third transistors N1, N2, and N3, and an inverter INV1. The first transistor EP1 is operated in response to an enable signal BLK_EN and coupled between a power supply voltage terminal and a first node NODE1. The second transistor EN1 is operated in response to the enable signal BLK_EN and coupled to a ground terminal. The third transistors N1, N2, and N3 are respectively operated in response to first row address signals XB, XC, and XD and coupled between the second transistor EN1 and the first node NODE1. The inverter INV1 is configured to output the first selection signal G BLOCK according to a potential of the first node NODE1.

The first subdecoder 510 can further include a transistor group 512 for preventing a potential of the first node NODE1 from becoming a high level or a low level more quickly when the first node NODE1 becomes a high level. The gates of transistors of the transistor group 512 are operated in response to the output signal of the inverter INV1.

The second subdecoder 522 includes a first logic gate NAND1 and a second logic gate NAND2. The first logic gate NAND1 outputs the second selection signal E BLOCK, in response to the first selection signal G BLOCK and the second row address signal XA_E. The second logic gate NAND2 outputs the third selection signal O BLOCK, in response to the first selection signal G BLOCK and an inverted signal of the second row address signal XA_O.

The first output circuit 524 includes an inverter INV2, a transistor N6, a transistor N5, a transistor N4, and a transistor P2. The inverter INV2 inverts a logical level of the second selection signal E BLOCK. The transistor N6 is operated in response to the second selection signal E BLOCK and coupled between a ground terminal and the output terminal SEL of the inverter INV2. The transistor N5 is operated in response to an enable signal PRE_EN and coupled between the output terminal of the inverter INV2 and the output node of the even block selection signal BSEL0. The transistor N4 is coupled to the input terminal of a pumping voltage VBLC and operated according to voltage of the output node. The transistor P2 is operated in response to the second selection signal E BLOCK and coupled between the transistor N4 and the output node. The first output circuit 524 can further include switching circuits N7, N8. The switching circuits N7, N8 transmit a ground voltage SEL GND to the drain select line DSL and the source select line SSL of a corresponding memory block in response to the second selection signal E BLOCK.

The second output circuit 526 has the same construction as the first output circuit 524 except that it is operated in response to the third selection signal O BLOCK, and a description thereof is omitted.

The transistors N4, N9 preferably are High Voltage Depletion (HVD) NMOS transistors. The transistors P2, P3 preferably are high voltage PMOS transistors. The transistors N5, N7, N8, N10, N12, and N13 preferably are high voltage NMOS transistors. In particular, the transistors N5, N10 are used to prevent the inverters INV2, INV3 or the transistors N6, N11 from being broken down when the block selection signals BSEL0, BSEL1 of a high voltage are output and are always turned on when a program operation is performed.

The row decoder as constructed above is provided in each pair of even and odd memory blocks including the even and odd memory blocks from among a plurality of memory blocks. Accordingly, since a small number of row decoders are included as compared with a case where the row decoder is provided every memory block, the area occupied by the row decoders can be reduced.

Hereinafter, the operation of the row decoder according to the embodiment of this disclosure is described below.

When the enable signal BLK_EN is inputted to the first subdecoder 510 and one memory block group is selected in response to the first row address signals XB, XC, and XD, the first node NODE1 becomes a low level. The inverter INV1 inverts a signal of a low level and outputs the first selection signal G BLOCK of a high level.

When the first selection signal G BLOCK and the second even row address signal XA_E of a high level are inputted, the second subdecoder 522 outputs the second selection signal E BLOCK of a low level in order to select an even memory block from the selected memory block group. That is, the second selection signal E BLOCK is activated. Furthermore, when the first selection signal G BLOCK and the second odd row address signal XA_O of a high level are inputted, the second subdecoder 522 output the third selection signal O BLOCK of a low level in order to select an odd memory block. That is, the third selection signal O BLOCK is activated.

When the second selection signal E BLOCK of a low level is inputted, the transistor P2 is turned on in response to the second selection signal E BLOCK, and the transistor N4 is turned on in response to the output signal of the inverter INV2. Accordingly, the first output circuit 524 outputs the pumping voltage VBLC as the even block selection signal BSEL0.

When the third selection signal O BLOCK of a low level is inputted, the transistor P3 is turned on in response to the third selection signal O BLOCK, and the transistor N9 is turned on in response to the output signal of the inverter INV3. Accordingly, the second output circuit 526 outputs the pumping voltage VBLC as the odd block selection signal BSEL1.

In accordance with the embodiments of this disclosure, a difference in the level of an operating voltage supplied to memory cells coupled to a word line is reduced, and a shift in an operating voltage supplied to a word line due to interference between the word line and a line is reduced. Accordingly, electrical characteristics and reliability of a semiconductor memory apparatus can be improved. Furthermore, since the size of a row decoder is reduced, a reduction of the area occupied by memory blocks can be prevented and so the degree of integration can be improved.

What is claimed is:

1. A semiconductor memory apparatus, comprising:
   a memory cell array comprising a plurality of memory blocks classified into a plurality of block groups;

a first subdecoder configured to output a first selection signal for outputting one of the block groups in response to an enable signal and first row address signals; and a second subdecoder configured to output a second selection signal or a third selection signal for selecting one of a pair of even and odd memory blocks from a block group, selected by the first subdecoder, in response to the first selection signal and a second row address signal.

2. The semiconductor memory apparatus of claim 1, wherein the first row address signals comprise:

first signals generated by decoding a first block address signal used to classify the memory blocks into a plurality of first subblock groups;

second signals generated by decoding a second block address signal used to classify the first subblock group into a plurality of second subblock groups; and three signals selected one by one from among third signals generated by decoding a third block address signal used to classify the second subblock group into a plurality of third subblock groups, wherein the second row address signal comprises two fourth signals for selecting a pair of even and odd memory blocks from among fourth signals generated by decoding a fourth block address signal used to select a memory block from the third subblock group.

3. The semiconductor memory apparatus of claim 1, wherein the first subdecoder comprises:

a first transistor operated in response to the enable signal and coupled between a power supply voltage terminal and a first node;

a second transistor operated in response to the enable signal and coupled to a ground terminal;

a third transistor operated in response to the first row address signals and coupled between the second transistor and the first node; and an inverter configured to output the first selection signal according to a potential of the first node.

4. The semiconductor memory apparatus of claim 3, wherein the first row address signals comprise:

first signals generated by decoding a first block address signal used to classify the memory blocks into a plurality of first subblock groups;

second signals generated by decoding a second block address signal used to classify the first subblock group into a plurality of second subblock groups; and three signals selected one by one from among third signals generated by decoding a third block address signal used to classify the second subblock group into a plurality of third subblock groups, wherein the second row address signal comprises two fourth signals for selecting a pair of even and odd memory blocks from among fourth signals generated by decoding a fourth block address signal used to select a memory block from the third subblock group.

5. The semiconductor memory apparatus of claim 1, wherein the second subdecoder comprises:

a first logic gate configured to output the second selection signal in response to the first selection signal and the second row address signal; and a second logic gate configured to output the third selection signal in response to the first selection signal and an inverted signal of the second row address signal.

6. The semiconductor memory apparatus of claim 5, wherein the first row address signals comprise:

first signals generated by decoding a first block address signal used to classify the memory blocks into a plurality of first subblock groups;

second signals generated by decoding a second block address signal used to classify the first subblock group into a plurality of second subblock groups; and three signals selected one by one from among third signals generated by decoding a third block address signal used to classify the second subblock group into a plurality of third subblock groups, wherein the second row address signal comprises two fourth signals for selecting a pair of even and odd memory blocks from among fourth signals generated by decoding a fourth block address signal used to select a memory block from the third subblock group.

7. The semiconductor memory apparatus of claim 1, further comprising:

a first output circuit for outputting an even block selection signal in response to the second selection signal; and a second output circuit for outputting an odd block selection signal in response to the third selection signal.

8. The semiconductor memory apparatus of claim 7, wherein:

the first output circuit outputs the even block selection signal having a higher voltage level than the second selection signal, and the second output circuit outputs the odd block selection signal having a higher voltage level than the third selection signal.

9. The semiconductor memory apparatus of claim 8, wherein the memory block comprises drain select transistors coupled to a local drain select line, memory cells coupled to local word lines, and source select transistors coupled to a local source select line.

10. The semiconductor memory apparatus of claim 9, further comprising a switching circuit for transferring a ground voltage to the local drain select line and the local source select line of an unselected memory block in response to the second selection signal of the second subdecoder.

11. The semiconductor memory apparatus of claim 7, wherein the first and second subdecoders and the first and second output circuits are provided in each pair of the even and odd memory blocks.

* * * * *